United States Patent [19]

Groves

[11] 4,087,412

[45] May 2, 1978

[54] ORGANOTIN CATALYST SYSTEM FOR ISOCYANATE REACTIONS

[75] Inventor: James D. Groves, Hudson, Wis.

[73] Assignee: Minnesota Mining and Manufacturing Company, Saint Paul, Minn.

[21] Appl. No.: 685,301

[22] Filed: May 11, 1976

[51] Int. Cl.$^2$ ............................................. C08G 18/24
[52] U.S. Cl. .......................... 260/75 NB; 252/431 C; 260/77.5 AB; 260/18 TN
[58] Field of Search .................. 260/77.5 AB, 75 NB; 252/431 C

[56] References Cited

U.S. PATENT DOCUMENTS

| | | | |
|---|---|---|---|
| 3,148,162 | 9/1964 | Gmitter et al. | 260/75 NB |
| 3,392,153 | 7/1968 | Hostettler et al. | 260/75 NB |
| 3,761,439 | 9/1973 | Ward et al. | 260/77.5 AB |

*Primary Examiner*—H.S. Cockeram
*Attorney, Agent, or Firm*—Cruzan Alexander; Donald M. Sell; Gerald F. Chernivec

[57] ABSTRACT

An organotin catalyst system for catalyzing the formation of polyurethane polymers comprising a catalytic amount of a mixture of a bis(tri-n-alkyl tin)oxide and the reaction product of a carboxylic acid and a dialkyl tin oxide.

8 Claims, No Drawings

ORGANOTIN CATALYST SYSTEM FOR ISOCYANATE REACTIONS

BACKGROUND OF THE INVENTION

This invention relates to an organotin catalyst system for promoting the reaction of organic isocyanates, i.e. NCO-containing compounds, with compounds having groups containing reactive hydrogen, as determined by the Zerewitinoff method described in J. Am. Chem. Soc., Vol. 49, p. 3181 (1927). The organotin catalyst system has particular utility in the preparation of polyurethanes, a broad class of organic polymers formed by the reaction of di- or poly- isocyanates with a number of difunctional or polyfunctional compounds having hydroxyl groups containing active hydrogen, e.g. water, polyols, polyethers, polyesters, and the like.

One effective class of catalysts to promote such reactions within reasonable reaction times have been the reaction products of carboxylic acids and dialkyl tin oxides, such as, for example, the dialkyl tin carboxylates disclosed in U.S. Pat. No. 3,392,128, and the Harada complex disclosed in U.S. Pat. Nos. 3,661,887 and 3,676,402.

It has now been ascertained that inclusion of a bis(tri-n-alkyl)oxide with the aforementioned catalysts provides a synergistic effect such that the catalyst concentration can be reduced without effecting the cure rate. Furthermore, this catalyst system appears to provide polyurethanes having improved hydrolytic and thermal stability over those prepared utilizing the carboxylic acid/dialkyl tin oxide catalyst alone.

SUMMARY OF THE INVENTION

In accordance with the invention there is provided an organotin catalyst system for the curing of urethane compositions, the catalyst system comprising a catalytic amount of a mixture of a bis(tri-n-alkyl tin)oxide and the reaction product of a carboxylic acid with a dialkyl tin oxide.

The catalyst system acts synergistically to allow a reduction in catalyst concentration necessary to effect cure over conventional catalysts and also imparts improved hydrolytic and thermal stability to the cured urethane.

DETAILED DESCRIPTION OF THE INVENTION

As aforementioned, one class of catalysts or curing agents for isocyanate systems is derived from the reaction of a carboxylic acid with a dialkyl tin oxide, in varying molar ratios. When one mole of dialkyl tin oxide is reacted with two moles of a carboxylic acid in the presence of a small amount of alkaline material, dialkyl tin dicarboxylates are formed. These compounds may be reasonably represented by the formula:

$R_2SnX_2$ wherein R represents an alkyl group containing from about 1 to about 8 carbon atoms and X represents a carboxylic acid radical containing from about 1 to about 22 carbon atoms.

When one mole of dialkyl tin oxide is reacted with a single mole of a carboxylic acid, again in the presence of a small amount of alkaline material, an addition compound, commonly termed an Harada complex is formed. Although the precise structure of the complex is unknown, and there is at present no known commercial source available, preparation of the complex can be readily undertaken by methods detailed in aforementioned U.S. Pat. Nos. 3,661,887 and 3,676,402.

Exemplary dialkyl tin dicarboxylates, which are commercially available, include dibutyl tin diacetate, dibutyl tin di(2-ethylhexanoate), dibutyl tin dilaurate, dibutyl tin diricinoleate, dibutyl tin dimaleate, dibutyl tin (bis-isooctylmaleate), etc.

Quite surprisingly, it has been found that addition of a bis(tri-n-alkyl tin)oxide to the carboxylic acid/dialkyl tin oxide catalyst affords a drastically reduced curing time or a reduction in the carboxylic acid/dialkyl tin oxide catalysts to attain a comparable cure rate. A preferred example of a tin oxide useful herein is bis(tri-n-butyl tin) oxide, commercially available as Bio M & T TBTO from the Metal and Thermite Co.

To illustrate the effect of a bis(tri-n-alkyl tin) oxide, the following illustrative example was prepared, wherein all parts are by weight unless otherwise specified.

EXAMPLE 1

A two-part reactive isocyanate composition was prepared by first mixing in a suitable vessel 15.49 parts of DDI-1410, tradename for a dimer acid diisocyanate commercially available from the General Mills Co., and 82.05 parts of Shellflex 371, tradename for an aliphatic/naphthenic oil commercially available from the Shell Oil Company. The oil typically acts as a conventional extender or plasticizer so as to provide a gel-like cured product.

A second part of the isocyanate composition was prepared by mixing 64.51 parts of Poly BD R-45HT, a tradename for a hydroxyl-terminated polybutadiene having an equivalent weight of about 1358 and an average of from 2.0 to 2.5 hydroxyl groups per molecule and commercially available from the Arco Chemical Co., 33.83 parts of Shellflex 371, and 0.7 part of M & T Catalyst T-8, tradename for dibutyl tin di (2-ethylhexanoate), commercially available from the Metal and Thermite Company.

The two parts were mixed on a 1:1 by weight basis, and this composition was labeled as Composition A.

A second composition was prepared exactly as Composition A with the exception that the 0.7 part of catalyst T-8 was replaced with 1.0 part of Bio M & T TBTO, tradename for bis(tri-n-butyl tin)oxide available from the Metal & Thermite Co. This composition was labeled as Composition B.

A third composition was prepared exactly as Composition A with the exception that catalyst T-8 concentration was reduced from 0.7 part to 0.1 part and 0.2 part of TBTO was added, the composition being labeled as Composition C.

To determine the cure time of the mixtures, a Sunshine gel meter was utilized, which is commercially available from Sunshine Scientific Instruments. This meter essentially consists of a driving motor and a rotating spindle, with a torsion spring coupling the driving motor to the spindle, the spindle then being suspended in the composition sample. The sample is typically maintained at any desired temperature by utilizing a constant temperature bath surrounding the sample cell. At the gel or cure point of the composition, the very pronounced increase in viscosity of the sample stops the rotating spindle, thereby closing an electric circuit which actuates the timing and alarm circuit of the gel meter. Utilizing a 100 gram mass of sample in the meter, the gel time of Composition A was determined to be 18 minutes at 25° C. The maximum exotherm of the reaction was determined to be 33° C. Similarly, the gel times of Compositions B and C were determined to be 19.0 and 18.3 minutes, respectively, at 25° C., with the maximum exotherms for both being 33° C. Composition C, with the combination of T-8 and TBTO thus had a comparable cure time to using T-8 alone.

EXAMPLES 2-4

The following Table further illustrates the synergistic effect of bis(tri-n-butyl tin)oxide (TBTO) on the activity of representative, commercially available dialkyl-tin dicarboxylates.

TABLE 1

| Weight % in Polyol of Example 1 | | Gel Time (min.) |
|---|---|---|
| M & T Catalyst T-1, a Dibutyl Tin Diacetate | TBTO | |
| 0.1 | — | 46.8 |
| 0.4 | — | 16.4 |
| 0.6 | — | 13.5 |
| 0.1 | 0.2 | 12.3 |
| 0.2 | 0.2 | 12.0 |
| 0.4 | 0.2 | 11.5 |
| M & T Catalyst T-12, a Dibutyl Tin Dilaurate | | |
| 0.5 | — | 26.4 |
| 1.0 | — | 17.6 |
| 0.5 | 0.2 | 13.6 |
| 1.0 | 0.2 | 13.3 |
| M & T Thermolite T-12, a Dibutyl Tin Diricinoleate | | |
| 0.5 | — | 24.2 |
| 1.0 | — | 17.8 |
| 0.5 | 0.2 | 13.6 |
| 1.0 | 0.2 | 12.6 |

The reasons for this unexpected synergistic effect of bis(tri-n-alkyl tin)oxide on the catalytic activity of the dialkyl tin oxide/carboxylic acid catalysts are not clearly understood.

However, the mechanism of a number of metal catalysts, for example ferric acetylacetonate, dibutyl tin dilaurate and cobalt (II) octoate, in aliphatic isocyanate-alcohol reactions was recently elucidated by A. E. Oberth and R. S. Bruenner in Ind. & Eng. Chem. Fund., 8(3), p. 383 (1969). In order to account for (1) the parabolic relationship between catalyst concentration and rate constant (i.e. a decrease in catalyst activity was observed with increasing concentration); and (2) the hyperbolic response of the rate constant to addition of small quantities of acetic acid (i.e. acetic acid decreased the rate of reaction), it was proposed that a partial alcoholysis of the metal catalyst was occurring to form free acid and an alkoxy-substituted metal salt.

The alkoxy-substituted metal salt then reacts with the isocyanate to form a complex which undergoes a rate determining rearrangement, forming the urethane.

It is felt that the primary contribution of the bis(tri-n-alkyl)oxide lies in its role as an acid acceptor, since it is known that alkyl-substituted tin oxides react readily with carboxylic acids to form the corresponding alkyl tin carboxylates.

During reaction, the bis(tri-n-alkyl tin)oxide possesses the capability of reacting with the aforementioned free acid formed, pursuant the proposed reaction sequence, so that the overall rate of reaction is increased.

Furthermore, it is known that dialkyl tin dicarboxylates contain trace amounts of unreacted carboxylic acid. It is thought that a portion of the bis(tri-n-alkyl tin)oxide initially reacts with this excess acid, present in the dialkyl tin dicarboxylate catalyst, such acids normally inhibiting the rate of reaction.

Thus, it is observed that the concentration of the dialkyl tin dicarboxylate can in effect be decreased in the presence of bis(tri-n-alkyl tin)oxide to effect a comparable cure rate.

The concentration ratio of the carboxylic acid/dialkyl tin oxide reaction product to the bis(tri-n-alkyl tin)oxide can be varied within rather wide limits, i.e. from about 5.0 to 1 to about 0.1 to 1. Generally speaking, the curing time decreases and the hydrolytic and thermal properties of the urethane improve as this weight ratio decreases.

The hydrolytic and thermal stability are also apparently enhanced by the ability of the bis(tri-n-alkyl tin)oxide to react with acidic moieties present. For example, in the presence of water, dialkyl tin dicarboxylates hydrolyze to form alkyl tin oxides and carboxylic acids. These acids accelerate the rate of hydrolytic degradation of polyurethanes. In the presence of the bis(tri-n-alkyl tin)oxides these acids are effectively removed, thus improving the polyurethane's hydrolytic stability. It is believed that the improved thermal stability also may be attributed in part to the removal of acidic impurities by the bis(tri-n-alkyl tin)oxide.

To illustrate the effectiveness of the catalyst system in improving the thermal and hydrolytic stability, the following examples are presented.

EXAMPLE 5

Compositions A, B, and C of Example 1 were prepared and cured. The thermal stability of each composition was measured utilizing two 1 inch by 2 inch by ¾ inch samples of each composition and determining weight loss and hardness characteristics on heating. The hardness of each sample was determined by a grease penetrometer (¼ cone) according to ASTM D-1403 and found to average 18, 23 and 18 respectively for the three urethane gels A, B, and C. All samples were then weighed and placed in an air circulating oven at 95° C for 30 days. The samples were allowed to equilibrate to room temperature (25° C) for six hours, weighed and their final hardness measured. The percentage weight loss for A, B, and C gels averaged 9.2, 8.6 and 8.5 respectively. The final average penetrometer readings were 28, 30 and 16. From these results it was apparent that the thermal stability of composition C utilizing both T-8 and TBTO was superior to either compositions A or B utilizing T-8 and TBTO alone.

The hydrolytic stability of urethane gels A, B and C were determined by measuring weight loss and hardness change in a manner exactly as above, except that the samples were placed in water at 95° C for 30 days. The initial penetrometer readings again averaged 18, 23 and 18 respectively for gels A, B, and C. The samples were allowed to equilibrate to room temperature for six hours, weighed and their final hardness measured. The percentage weight change of gel A and gel C was −0.20 and −0.18 respectively. The weight change of the gel B could not be determined because of hydrolytic degradation. The final average penetrometer readings were 68, N.D. (> 110) and 30 respectively for the gels A, B, and C. From these results it was obvious that the hydrolytic stability of composition C, utilizing both T-8 and TBTO was vastly superior to either compositions A or B utilizing T-8 and TBTO alone.

EXAMPLES 6-7

As representative of the improvements in hydrolytic and thermal stability obtained when TBTO is utilized with the dialkyltin dicarboxylate catalysts in general, two compositions were prepared as per Composition A of Example 1. In one, the T-8 catalyst was replaced with 0.4 parts of dibutyl tin diacetate (M & T Catalyst T-1) and in the other with 0.1 parts of dibutyl tin diacetate and 0.2 parts of TBTO. See Table 2 below.

TABLE 2

| Catalyst | Thermal Stability of Cured Samples | (95° C/30 days) | |
|---|---|---|---|
| | Percent Weight Change | Penetrometer Readings | |
| | | Initial | Final |
| M & T Catalyst T-1 alone | 9.66 | 17 | 25 |
| M & T Catalyst T-1 and TBTO | 9.3 | 17 | 15 |
| | Hydrolytic Stability of Cured Samples | (95° C H$_2$O/30 days) | |
| | Percent Weight Change | Penetrometer Readings | |
| | | Initial | Final |
| M & T Catalyst T-1 alone | +0.15 | 17 | 94 |
| M & T Catalyst T-1 and TBTO | −0.02 | 17 | 42 |

EXAMPLES 8-9

Two compositions similar to composition A of Example 1 were prepared, except that in one the T-8 catalyst was replaced with 1.0 part of dibutyl tin diricinoleate (Thermolite-12) and in the other with 0.1 parts of Thermolite −12 and 0.2 parts of TBTO. Results are shown in Table 3.

TABLE 3

| Catalyst | Thermal Stability of Cured Samples | (95° C/30 days) | |
|---|---|---|---|
| | Percent Weight Change | Penetrometer Readings | |
| | | Initial | Final |
| Thermolite T-12 alone | −7.5 | 16 | 22 |
| Thermolite T-12 with TBTO | −9.6 | 16 | 14 |
| | Hydrolytic Stability of Cured Samples | (95° C H$_2$O/30 days) | |
| | Percent Weight Change | Penetrometer Readings | |
| | | Initial | Final |
| Thermolite T-12 alone | +0.01 | 16 | 77 |
| Thermolite T-12 with TBTO | −0.11 | 16 | 29 |

Exemplary polyisocyanates, as used herein, are typically of the general formula $$R(NCO)_x$$

wherein x is 2 or more, and R can be substituted or unsubstituted alkylene, substituted or unsubstituted arylene, a hycrocarbon containing aryl-NCO bonds and alkyl-NCO bonds, etc. Examples of such compounds include hexamethylene diisocyanate, xylylene diisocyanate, phenylene and tolylene diisocyanates, dimer acid diisocyanate, isophorone diisocyanate, trimethylhexamethylene diisocyanate, 4,4'-methylene-bis(cyclohexylisocyanate), etc.

Active hydrogen-containing compounds typically used for urethane formation include compounds containing two or more hydroxyl groups, such as ethylene glycol, glycerol, 1, 2, 6-hexane-triol, sorbitol, castor oil, polyesters, polyethers, polyoxyalkylene polyols, polyalkadiene polyols, etc.

What is claimed is:

1. An organotin catalyst system for catalyzing the formation of urethane compounds comprising a catalytic amount of a mixture of a bis(tri-n-alkyl tin)oxide and the reaction product of a dialkyl tin oxide with a carboxylic acid, wherein the concentration ratio of said reaction product to said bis(tri-n-alkyl tin)oxide is from about 5.0 to 1 to about 0.1 to 1.

2. The catalyst system of claim 1 wherein said reaction product is a dialkyl tin dicarboxylate.

3. The catalyst system of claim 2 wherein said dialkyl tin dicarboxylate is dibutyl tin di-2-ethylhexanoate.

4. The catalyst system of claim 1 wherein said bis(tri-n-alkyl tin)oxide is bis(tri-n-butyl tin)oxide.

5. A process comprising the steps of:
(a) mixing together in reaction proportions an organic polyisocyanate and a compound having terminal hydroxy groups containing active hydrogen, together with
(b) a catalytic amount of an organotin catalyst system for catalyzing the reaction of the components of (a), said catalyst system comprising a mixture of a bis(tri-n-alkyl tin)oxide and the reaction product of a dialkyl tin oxide with a carboxylic acid, wherein the concentration ratio of said reaction product to said bis(tri-n-alkyl tin)oxide is from about 5.0 to 1 to about 0.1 to 1.

6. The process of claim 5 wherein said reaction product is a dialkyl tin dicarboxylate.

7. The process of claim 6 wherein said dialkyl tin dicarboxylate is dibutyl tin di-2-ethylhexanoate.

8. The process of claim 5 wherein said bis(tri-n-alkyl tin)oxide is bis(tri-n-butyl tin)oxide.

* * * * *